US006559667B1

(12) United States Patent
Tarter

(10) Patent No.: US 6,559,667 B1
(45) Date of Patent: May 6, 2003

(54) PROGRAMMING THERMAL TEST CHIP ARRAYS

(75) Inventor: Thomas S. Tarter, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/734,551

(22) Filed: Dec. 13, 2000

Related U.S. Application Data

(60) Provisional application No. 60/214,454, filed on Jun. 28, 2000.

(51) Int. Cl.[7] .............................................. G01R 31/26
(52) U.S. Cl. ........................ 324/760; 324/754; 324/758
(58) Field of Search ................................. 324/760, 754, 324/758, 158.1

(56) References Cited

U.S. PATENT DOCUMENTS

| | | | | |
|---|---|---|---|---|
| 3,496,333 A | * | 2/1970 | Alexander et al. ........... 347/209 |
| 3,501,615 A | * | 3/1970 | Merryman et al. .......... 347/209 |
| 4,730,160 A | | 3/1988 | Cusack et al. |
| 4,782,340 A | * | 11/1988 | Czubatyj et al. ............. 340/765 |
| 5,233,161 A | * | 8/1993 | Farwell et al. ............ 324/158.1 |
| 5,309,090 A | * | 5/1994 | Lipp ........................... 324/760 |
| 5,406,212 A | * | 4/1995 | Hashinaga et al. .......... 324/760 |
| 5,424,651 A | * | 6/1995 | Green et al. ................. 324/754 |
| 5,594,273 A | * | 1/1997 | Dasse et al. ................. 257/620 |
| 5,673,218 A | * | 9/1997 | Shepard ....................... 365/105 |
| 5,754,158 A | * | 5/1998 | Misawa et al. ............. 324/770 |
| 5,886,564 A | * | 3/1999 | Sato et al. ................ 324/158.1 |
| 6,203,191 B1 | * | 3/2001 | Mongan ....................... 374/43 |

\* cited by examiner

*Primary Examiner*—Kamand Cuneo
*Assistant Examiner*—Jermele Hollington

(57) ABSTRACT

A thermal test chip array and method of forming the same allows access to any test die in the array regardless of the size of the array. The thermal test chip arrangement has a plurality of thermal test chips arranged in an array, each thermal test chip having a heating circuit and a temperature-sensing circuit. A first set of conductive lines traverse unbroken across the entire array. The heating circuit of each thermal test chip is connected to some of the first set of conductive lines. These conductive lines provide power to the heating circuits of the thermal test chips. A second set of conductive lines traverse unbroken across the entire array with the temperature-sensing circuit of each thermal test chip being connected to some of the second set of conductive lines. Power is carried to the temperature sensing circuits of the thermal test chips by the second set of conductive lines.

20 Claims, 2 Drawing Sheets

PRIOR ART

PROGRAMMING THERMAL TEST CHIP ARRAYS

RELATED APPLICATIONS

This application claims priority from Provisional Application Ser. No. 60/214,454 filed on Jun. 28, 2000 entitled: "PROGRAMMABLE THERMAL TEST CHIP ARRAY", the entire disclosure of which is hereby incorporated by reference therein.

FIELD OF THE INVENTION

The present invention relates to the field of integrated circuit testing, and more particularly, to the testing of the thermal characteristics of a semiconductor package.

DESCRIPTION OF RELATED ART

The testing of a package containing integrated circuits has become more complicated and important as the current densities increase. High operating temperatures will shorten the lifetime of a semiconductor device. In performing thermal testing, conventional methodology uses a dummy device to supply power and read temperature off the device. Typically, a certain amount of current is put through the dummy device to change the temperature of the device. The temperature is read by a diode or other temperature sensor that is calibrated and reacts in a linear manner with temperature changes.

One concern with such methodology using dummy devices is that the actual emulated devices are very complex, making it difficult to perform a test that accurately emulates the thermal signature of the actual device. In the prior art, this problem is attempted to be overcome by using arrays of smaller dies that are formed to simulate a production die. For example, assume that a microprocessor die is 300 mils×300 mils. A thermal test die may be made of a number of smaller test dies having dimensions of 50×50 mils. Hence, a 6×6 array of smaller test dies is formed that will emulate the larger production die.

A single thermal test chip, such as provided in the prior art, is depicted in FIG. 1. This thermal test chip is 100 mils on each side and includes a heating element, such as a resistive heating element 12, and a sensing element, such as a diode 14. The power to the resistive heating element 12 is provided by leads 16 at one edge of the die 10. Similarly, forward biasing signals are provided at leads 18 of the die 10.

The thermal test chips 10 are assembled into an array, in the prior art, such as that depicted in FIG. 2, which shows a 5×5 array. One of the concerns with such an array 20 is that only the exterior thermal test chips 10 are accessible to provide power for heating the resistive elements 12 or the forward biasing voltages to the diode 14. Hence, there is no access to the thermal test chips in the middle of the array, indicated by the shaded squares in FIG. 2. This inability to access any of the individual chips 10 reduces the accuracy and testability of a thermal test chip array. Furthermore, it was not possible to individually activate selected ones of the thermals test chips within the middle of the array, reducing accuracy of emulation.

One method of overcoming some of these limitations is to perform "stitch bonding" of the individual thermal test chips to one another. This required a complicated chip bonding technique and the wire bonds are of higher resistance than the metal traces that extend through the test chips 10. Therefore, there is a voltage drop caused by the mismatch in resistances between the wire bonds and the traces and an error would be created in the temperature readings. Hence, there was no continuous connection of the thermal test chip arrays that would provide access to the internal test chips within the array.

SUMMARY OF THE INVENTION

There is a need for a thermal test chip arrangement which provides modularity in allowing a plurality of test chips to be formed into an array of selected dimensions, yet provides access to internal test chips in the array without requiring connection techniques such as stitch bonding.

These and other needs are met by embodiments of the present invention which provide a thermal test chip arrangement comprising a plurality of thermal test chips arranged in an array, each thermal test chip having a heating circuit and a temperature sensing circuit. A first set of conductive lines traverse unbroken across the array with the heating circuit of each thermal test chip being connected to some of the first set of conductive lines. The first set of conductive lines provides power to the thermal test chips. A second set of conductive lines traverse unbroken across the entire array with the temperature sensing circuit of each thermal test chip being connected to some of the second set of conductive lines. The second set of conductive lines carries power to the temperature sensing circuits of the thermal testing chips.

By providing conductive lines which traverse unbroken across the entire array of thermal test chips, a metallization method by which any chip in a multiple array of thermal test chips can be addressed to supply heating power or temperature sensors, is produced. This allows conditional selecting of thermal test chips, increasing the accuracy and testability, as well as the flexibility of the emulation by the thermal test chip.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the inflexibility and low accuracy of prior thermal emulator test arrays. These problems are solved, in part, by the provision of a thermal test chip arrangement in which a repeated array of thermal test chips are provided, each thermal test chip having a heating circuit and a temperature-sensing circuit. Conductive lines are provided that traverse unbroken (continuously) across the entire array. The heating circuit of each thermal test chip is connected to the conductive lines, and the temperature-sensing circuit of each thermal test chip is connected to the conductive lines. By laying out the lines in a grid-like pattern that stretches across the array of test chips, flexibility is provided since individual test chips in the array may be accessed separately from the other test chips in the array by providing power on only selected ones of the conductive lines. Flexibility is further enhanced by the modular nature of the test chip array as different size production dies may be emulated by increasing or decreasing the size of the array. Accuracy and testability are enhanced by providing the lines that are unbroken across the entire array, rather than through complicated methods of connecting the thermal test chips to each other, such as by stitch bonding.

Figure 1:
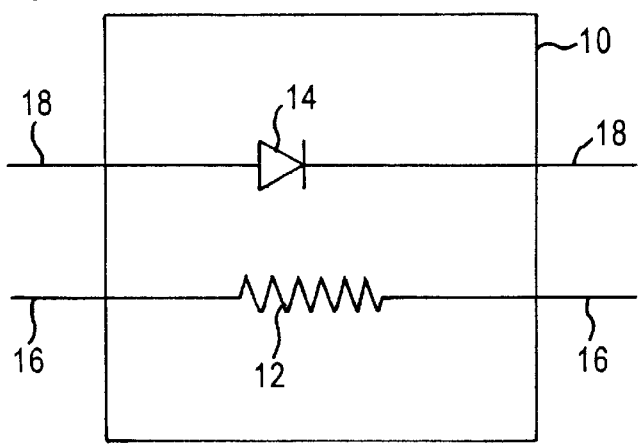
FIG. 1 is a single thermal test chip constructed in accordance with the prior art.
Figure 2:
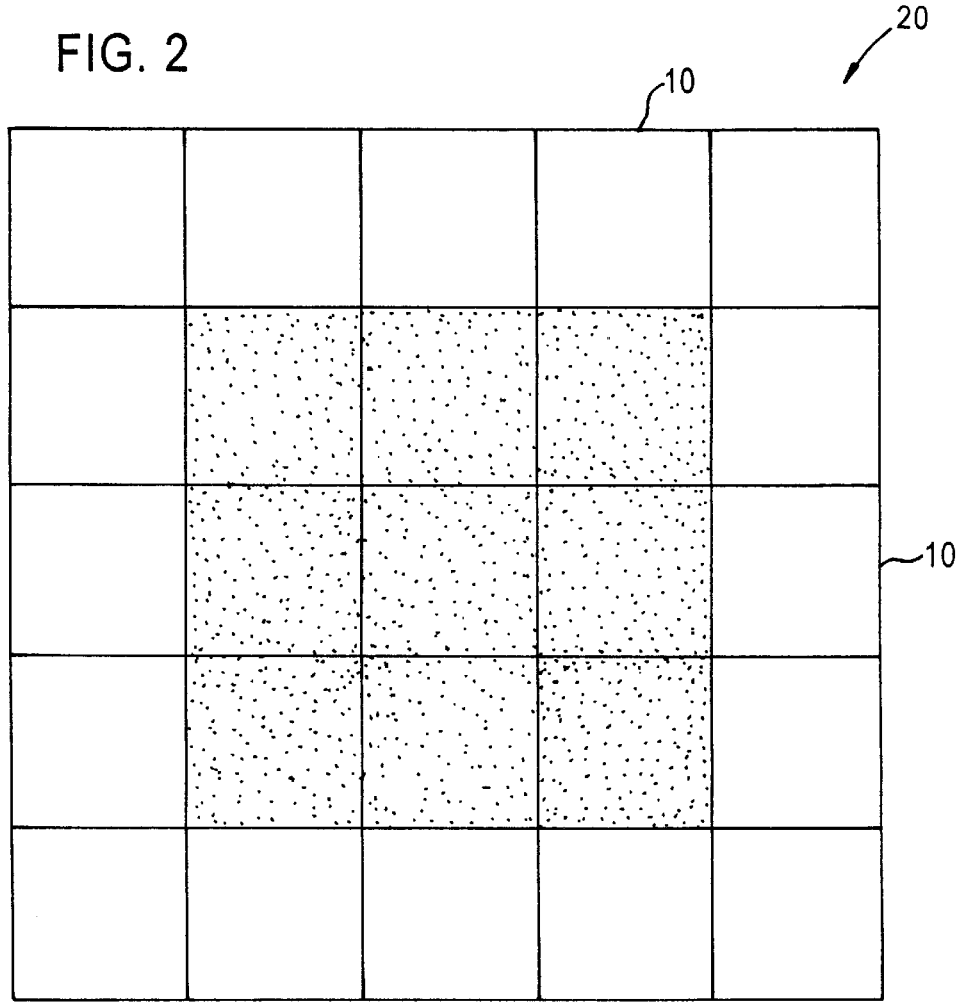
FIG. 2 is a thermal test chip array constructed from the thermal test chip of FIG. 1 in accordance with the prior art.
Figure 3:
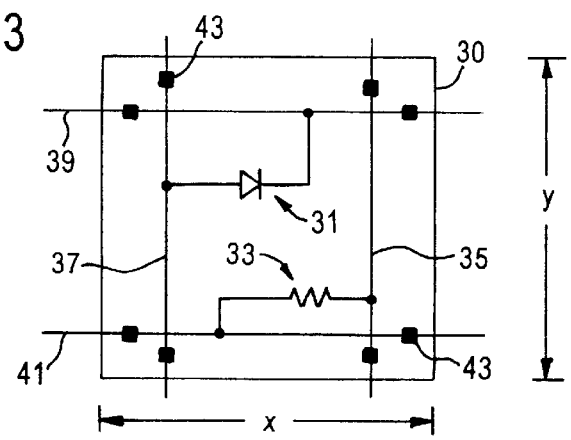
FIG. 3 is a thermal test chip constructed in accordance with embodiments of the present invention.

FIG. 3 depicts a single thermal test chip 30 that has been constructed in accordance with an embodiment of the present invention. The thermal test chip 30 includes a temperature-sensing circuit 31, which may include a diode in certain embodiments. In other embodiments, however, the temperature-sensing element may be a metal line, transistor or other circuit that can accurately sense temperature. In the following described embodiments, however, the temperature-sensing element 31 will be described as a diode.

The thermal test chip 30 has a heating circuit 33 that is formed by a resistance heating element 33, for example. In certain embodiments of the invention, the resistance heating element 33 is formed by a serpentine aluminum, diffused resistor. The heating circuit 33 simulates the device power dissipation in an area equivalent to the area of the thermal test chip 30.

The thermal test chip 30 has a dimension of x and y, as depicted in FIG. 3. Thermal test chip 30 is generally rectangular, although in certain embodiments, such as that of FIG. 3, x and y are equal to each other to form a square thermal test chip 30. In the exemplary embodiment described, x and y are equal to 100 mils so that the thermal test chip 30 is a square 100×100 mil test chip.

The resistance heating element 33 is connected between a first set of conductive lines 35, 41. Conductive line 35 traverses in a vertical direction in FIG. 3 across the thermal test chip 30. Conductive line 41 traverses horizontally, in FIG. 3, across the test chip 30. These lines are formed in different metallization planes during formation of the thermal test chip 30, such that the vertical lines are formed in one layer, and the horizontal lines are formed in another layer.

Activation of the heating element of the thermal test chip 30 is provided by supplying power on the conductive lines 35, 41. As will be explained in more detail later, when the thermal test chip 30 is part of a larger array of thermal test chips, the individual thermal test chip 30 may be selected by providing power on conductive lines 35 and 41 to heat the resistance heating element 33.

A second set of conductive lines 37, 39 also traverse across the thermal test chip 30. The diode 31, preferably a p-n diode that is to be forward-biased, is coupled between the vertical conductive line 37 and the horizontal conductive line 39. Appropriate voltages are applied on the conductive lines 37 and 39 to forward bias the diode.

A plurality of bonding pads 43 are provided on the thermal test chip 30. These bonding pads 43 are located on the conductive lines 35, 37, 39 and 41. Hence, the bonding pads 43 correspond to the row and column metallization and are used to connect to the package through wire bonding or other methodology.

The thermal test chip 30 is formed as a repeatable pattern in a wafer, with metallization lines 35, 37, 39 and 41 extending across the wafer in an orthogonal grid. In order to emulate an integrated circuit chip that is of a given dimension, for example having a width w and a length l, an array of test chips 30 is separated from the wafer by cutting along the scribe lines 32, for example. Since the test chips 30 are already attached to one another in the array, and the metallization lines 35, 37, 39 and 41 extend unbroken in an orthogonal grid over the array, further processing to attach the thermal test chips 30 together are not necessary. This provides a distinct advantage over prior art methodologies in which the thermal test chips need to be connected, by stitch bonding, for example.

Figure 4:
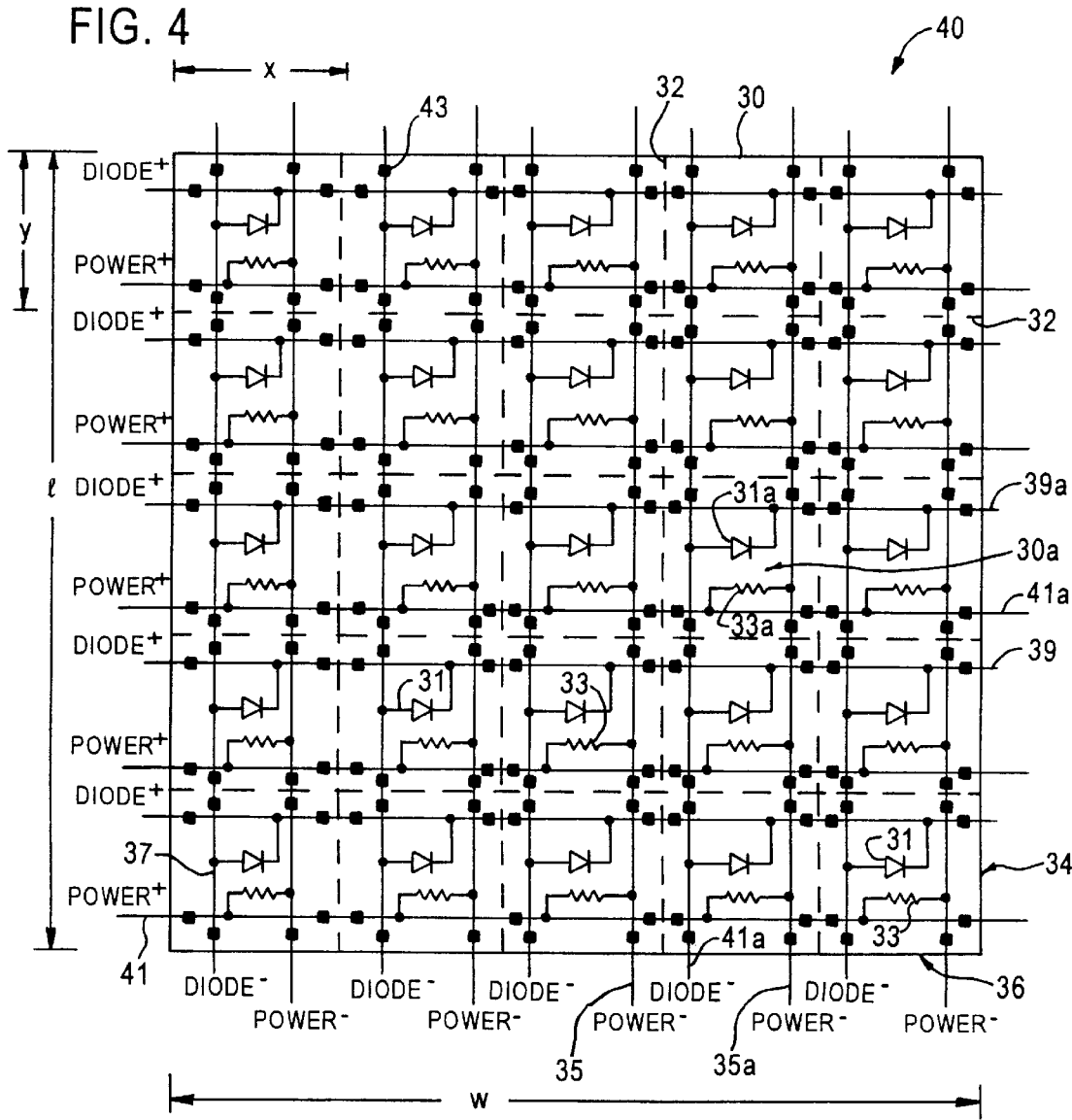
FIG. 4 is a thermal test chip array constructed from the thermal test chip of FIG. 3 in accordance with embodiments of the present invention.

An example of a thermal test chip array is depicted in FIG. 4 and has reference numeral 40. This thermal test chip array 40 is a 5×5 array that has been separated from a wafer having the repeating patterns of a thermal test chip 30. The thermal test chip array 40 has overall dimensions w and l, to emulate a semiconductor die chip that also has dimensions of w and l. In the exemplary embodiment of FIG. 4, w and l are equal to each other, such that the die being emulated is a square die. Also, in the exemplary embodiment, each thermal test chip 30 has equal dimensions on each side, such that x is equal to y. Hence, along the width of the array, (along side 36), the number of thermal test chips needed is equal to w/x. Similarly, along the length l (side 34) of the thermal test chip array 40, the number of thermal test chips that is needed is equal to l/y. The total number N of thermal test chips 30 needed to form the thermal test chip array 40 is, therefore, N equal (w/x) (l/y). To provide a numerical example, assume that the semiconductor chip to be emulated is 500 mils×500 mils. Also, assume that the dimensions of each of the thermal test chips 30 are 100 mils×100 mils. This leads to the number of thermal test chips 30 being 5 in each of the w and l dimensions. The total number N of thermal test chips 30 in thermal test chip array 40 is, therefore, equal to 25. Hence, the number of thermal test chips 30 in an array 40 is dependent upon the dimensions of the semiconductor chip being emulated and the size of the thermal test chips 30 that are used.

The thermal test chip array 40 is cut along scribe lines 32 from the larger wafer when the thermal test chip array 40 is being prepared, as mentioned earlier. The scribe lines 32 within the thermal test chip array that is separated from the wafer are not cut, as depicted in FIG. 4.

Each of the individual thermal test chips 30 within the array 40 may be separately addressed by selection of the conductive lines 35, 37, 39 and 41. For example, the internal thermal test chip designated as reference number 30A in FIG. 4 may be selected by providing appropriate power on lines 35A, 37A, 39A and 41A. This activates the heating circuit formed by the resistance heating element 33A and forward biases the diode 31A of the temperature-sensing circuit.

By proper selection of the power being applied to the conductive lines 35, 37, 39 and 41, the thermal test chip array may be.programmed to emulate the thermal signature of a semiconductor chip in an accurate manner. As the metallization lines extend unbroken across the entire array, formation of the thermal test chip array is accomplished in an efficient manner, and testing reliability is enhanced. Furthermore, various test die sizes may be readily formed by separating from a larger wafer a section that has the desired dimensions. Since the lines extend unbroken across the array, even after separation of the array from the wafer, further processing such as stitch bonding is not required to connect the thermal test chips together. This allows the thermal test chips within the interior of the array to be readily tested.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A thermal test chip arrangement comprising:
   a plurality of thermal test chips configured to emulate a thermal signature of an integrated circuit and arranged in an array, each thermal test chip having a heating circuit and a temperature-sensing circuit;
   a first set of conductive lines that traverse unbroken across the entire array with the heating circuit of each thermal test chip being connected to some of the first set of conductive lines, the first set of conductive lines providing power to the heating circuits of the thermal test chips; and
   a second set of conductive lines that traverse unbroken across the entire array with the temperature-sensing circuit of each thermal test chip being connected to some of the second set of conductive lines, the second set of conductive lines carrying power to the temperature-sensing circuits of the thermal test chips.

2. The arrangement of claim 1, wherein the thermal test chips are in an n x m array, in rows and columns.

3. The arrangement of claim 2, wherein a respective one of the first set of conductive lines traverses unbroken across each row of test chips, and a respective one of the first set of conductive lines traverses across each column of thermal test chips.

4. The arrangement of claim 3, wherein the heating circuit of each test chip comprises a resistance element connected between one of the first conductive lines traversing the column of thermal test chips and one of the first conductive lines traversing the row of thermal test chips.

5. The arrangement of claim 4, wherein a respective one of the second set of conductive lines traverses unbroken across each row of test chips, and a respective one of the second set of conductive lines traverses across each column of thermal test chips.

6. The arrangement of claim 5, wherein the temperature-sensing circuit of each test chip comprises a diode connected between one of the second conductive lines traversing the column of thermal test chips, and one of the second conductive lines traversing the row of thermal test chips.

7. The arrangement of claim 6, wherein each second conductive line traversing one of the columns of thermal test chips is set at a first voltage potential and each second conductive line traversing one of the rows of thermal test chips is set at a second voltage potential, and each diode is connected to be forward-biased.

8. The arrangement of claim 7, wherein each first conductive line traversing one of the columns of thermal test chips is set at a first voltage potential and each first conductive line traversing one of the rows of thermal test chips is set at a second voltage potential, such that a voltage drop is present across the resistance element in each of the thermal test chips.

9. The arrangement of claim 8, further comprising a plurality of bond pads, with at least one of the bond pads being provided on each of the conductive lines within each of the thermal test chips.

10. The arrangement of claim 9, wherein a plurality of bond pads are provided on each of the conductive lines within each of the thermal test chips.

11. A method of forming a thermal test chip arrangement to thermally emulate an integrated circuit that has dimensions of w and l, comprising:
    forming an array of thermal test chips, each thermal test chip having a dimension of x by y, the array comprising a total number (N) of thermal test chips that is equal to (w/x)(l/y), each thermal test chip having a heating element and a sensing element;
    forming metallization lines that extend unbroken across the entire array in a grid, the heating element and the sensing element of each thermal test chip being connected between at least two of the lines; and
    connecting the metallization lines to power sources that provide electric power to the heating element and the sensing element of each thermal test chip.

12. The method of claim 11, further comprising forming bond pads on the metallization lines within each thermal test chip.

13. The method of claim 11, wherein each heating element includes a resistance element.

14. The method of claim 13, wherein each sensing element is a forward-biased diode.

15. The method of claim 14, wherein the thermal test chips are arranged in a rectangular array in rows and columns.

16. The method of claim 15, wherein the metallization lines include heating power lines and diode-biasing lines.

17. The method of claim 16, wherein each column of thermal test chips has a respective one of the heating power lines and one of the diode-biasing lines extending vertically across the column, and each row of thermal test chips has a respective one of the heating power lines and one of the diode-biasing lines extending horizontally across the row to thereby form a grid of metallization lines with horizontal and vertical heating power lines and horizontal and vertical diode-biasing lines in each of the thermal test chips.

18. The method of claim 17, wherein the diode in each thermal test chip is connected between the horizontal and vertical diode-biasing lines in that thermal test chip, and the resistance element in each thermal test chip is connected between the horizontal and vertical heating power lines in that thermal test chip.

19. The method of claim 18, wherein the array of thermal test chips is separated from a larger array of thermal test chips.

20. The method of claim 19, wherein the larger array of thermal test chips has scribe lines and the array of thermal test chips is cut from the larger array of thermal test chips along the scribe lines.

* * * * *